(12) United States Patent
Ma et al.

(10) Patent No.: US 11,616,129 B2
(45) Date of Patent: Mar. 28, 2023

(54) CONTACT PHOTOLITHOGRAPHY-BASED NANOPATTERNING USING PHOTORESIST FEATURES HAVING RE-ENTRANT PROFILES

(71) Applicant: Wisconsin Alumni Research Foundation, Madison, WI (US)

(72) Inventors: Zhenqiang Ma, Middleton, WI (US); Yei Hwan Jung, Seoul (KR)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 17/123,453

(22) Filed: Dec. 16, 2020

(65) Prior Publication Data

US 2021/0143262 A1     May 13, 2021

Related U.S. Application Data

(62) Division of application No. 15/895,440, filed on Feb. 13, 2018, now Pat. No. 10,903,329.

(51) Int. Cl.

| | |
|---|---|
| *H01L 29/423* | (2006.01) |
| *H01L 21/28* | (2006.01) |
| *H01L 21/283* | (2006.01) |
| *H01L 21/308* | (2006.01) |
| *H01L 23/00* | (2006.01) |
| *H01L 29/778* | (2006.01) |
| *H01L 21/768* | (2006.01) |
| *H01L 29/40* | (2006.01) |
| H01L 29/66 | (2006.01) |
| H01L 29/20 | (2006.01) |

(52) U.S. Cl.
CPC ...... *H01L 29/42376* (2013.01); *H01L 21/283* (2013.01); *H01L 21/28114* (2013.01); *H01L 21/3086* (2013.01); *H01L 21/76885* (2013.01); *H01L 24/03* (2013.01); *H01L 24/05* (2013.01); *H01L 29/401* (2013.01); *H01L 29/42316* (2013.01); *H01L 29/778* (2013.01); *H01L 29/2003* (2013.01); *H01L 29/66462* (2013.01); *H01L 29/7786* (2013.01); *H01L 2224/03472* (2013.01); *H01L 2224/05016* (2013.01)

(58) Field of Classification Search
CPC ............. H01L 29/42376; H01L 29/401; H01L 29/778; H01L 29/2003; H01L 29/66462; H01L 29/7786; H01L 24/03; H01L 24/05
See application file for complete search history.

(56) References Cited

U.S. PATENT DOCUMENTS

| | | | | |
|---|---|---|---|---|
| 9,018,051 B2* | 4/2015 | Dove | ................ | H01L 29/66553 438/142 |
| 2011/0315950 A1* | 12/2011 | Sleight | ................... | B82Y 10/00 257/E29.245 |
| 2012/0139054 A1* | 6/2012 | Yin | .................... | H01L 29/66545 257/E21.409 |
| 2017/0358495 A1* | 12/2017 | Jiang | .................... | H01L 29/1066 |
| 2018/0335874 A1* | 11/2018 | Li | ............................ | G06F 3/047 |

* cited by examiner

*Primary Examiner* — Christine A Enad
(74) *Attorney, Agent, or Firm* — Bell & Manning, LLC

(57) ABSTRACT

Patterning methods for forming patterned device substrates are provided. Also provided are devices made using the methods. The methods utilize photoresist features have re-entrant profiles to form a secondary metal hard mask that can be used to pattern an underlying device substrate.

5 Claims, 12 Drawing Sheets

CONTACT PHOTOLITHOGRAPHY-BASED NANOPATTERNING USING PHOTORESIST FEATURES HAVING RE-ENTRANT PROFILES

CROSS REFERENCE TO RELATED APPLICATIONS

The present application is a divisional of U.S. patent application Ser. No. 15/895,440 that was filed Feb. 13, 2018, the entire contents of which are incorporated herein by reference.

REFERENCE TO GOVERNMENT RIGHTS

This invention was made with government support under FA9550-13-C-0008 awarded by the USAF/AFOSR. The government has certain rights in the invention.

BACKGROUND

Photolithography based on optical masks is widely used in research laboratories due to its low-cost, simple mechanism, and ability to pattern micron-sized features on a wafer scale area. Because the resolution of optical lithography is limited by the wavelength of the light source that is used, techniques to utilize short wavelength light sources, such as the KrF (248 nm) laser, ArF (198 nm) laser, or even soft X-rays, also known as extreme ultraviolet (EUV), have been developed for smaller patterning scales. In addition, resolution enhancement techniques that involve multiple optical elements in conjunction with the above-mentioned optical light sources have further reduced the patterning scales. However, the high cost of such short wavelength light sources and optical elements presents challenges in product cost management and in research and development.

Contact photolithography technology that utilizes a Hg lamp (365 nm, 405 nm, and 436 nm) as a light source is commonly used in academic laboratories, because of its low cost, wafer-scale productivity, and accessible applicability to diverse microfabrication processes. Despite its benefits, contact photolithography is limited in its ability to create high-resolution patterns, due to the diffraction limit of the light source, which creates difficulties in the research and development for nanoscale devices. Alternative methods using near-field photolithography have been introduced to pattern sub-wavelength features by circumventing the diffraction by: coupling and guiding light through elastomeric polymers masks; using evanescent near-field optical lithography with conformable membrane masks; employing surface plasmon polariton with periodic metal masks; and using beam pen lithography with metal-coated nanoscale apexes on polydimethylsiloxane (PDMS) masks. These techniques, however, require unique mask designs and materials that increase cost and processing time.

SUMMARY

Patterning methods for forming patterned device substrates are provided. Also provided are patterned substrates and devices made using the methods.

One embodiment of an electronic device includes: a substrate having a substrate surface; and an electrical contact having a trapezoidal cross-sectional profile on the substrate surface, the electrical contact having an upper surface, a base in contact with the substrate surface, and a sidewall connecting the upper surface to the base, wherein the electrical contact is tapered from the upper surface to the base, such that the width of the upper surface is larger than the width of the base, and further wherein the width of the base is less than 100 nm.

One embodiment of a method of patterning a substrate includes: forming one or more photoresist features on a substrate surface, the photoresist features having a re-entrant cross-sectional profile; depositing a conformal layer of mask material over the one or more photoresist features and the substrate surface; removing the one or more photoresist features from the substrate surface, whereby the remaining mask material forms a hard mask defining one or more openings through which the substrate surface is exposed; and patterning the substrate surface through the one or more openings.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 2A shows SEM images of the photoresist feature as developing time is increased. The dashed lines indicate the interface between a Cr layer and the photoresist feature to show the re-entrant profile of the feature. FIG. 2B shows a schematic of the re-entrant feature's profile change as the developing process proceeds. FIG. 2C is a graph of the measured widths of the photoresist feature as a function of the developing time. FIG. 2D is an enlargement of the final SEM image of FIG. 2D showing a re-entrant angle of 84°, a top width of 271 nm, and a base width of 79 nm.

FIG. 3A is a schematic of a secondary hard mask layer after removal of the photoresist. FIG. 3B, panels (i) through (vi), show SEM images of an exposed substrate viewed through Cr hard masks having different hard mask opening sizes. The sizes of the hard mask openings are 500 nm, 600 nm, 700 nm, 800 nm, 900 nm, and 1 µm from (i) to (vi), respectively. FIG. 3C is a graph of hard mask opening width versus original mask opening width and the corresponding reduction in opening width.

FIG. 4A shows the deposition of the sub-100 nm metal strip. FIG. 4B shows dry-etching of the substrate using a Cr layer as a mask. FIG. 4C shows a magnified image of the dry-etched trench area. FIG. 4D depicts deposited metal strips. FIG. 4E depicts metal deposited in a spiral shape. FIG. 4F shows metal deposited in a donut shape.

FIG. 5A is a schematic of an AlGaN/GaN HEMT structure. FIG. 5B shows an SEM image of an HEMT device after gate metal deposition. FIG. 5C shows arrays of HEMT devices after a via hole opening process. FIG. 5D shows the DC performance of an HEMT device. FIG. 5E shows the normalized I-V characteristics of the HEMT device. FIG. 5F shows enhancement of RF performance after reducing the gate length with contact photolithography-based nanopatterning.

DETAILED DESCRIPTION

Patterning methods for forming patterned device substrates are provided. Also provided are patterned substrates and devices made using the methods.

In the methods, one or more photoresist features having re-entrant cross-sectional profiles are formed on a substrate surface. A conformal layer of mask material is then isotropically deposited over the photoresist features and the substrate surface. The photoresist features are then removed and the remaining layer of mask material provides a mask over the substrate surface. The substrate surface can then be patterned using the mask to define a pattern in or on the substrate. The patterning can be an additive process (e.g., by depositing a material onto the substrate surface), a subtractive process (e.g., by removing portions of the substrate; for example, by etching the substrate surface), or a combination of additive and subtractive processes. Once the substrate surface has been patterned, the mask may be removed from the substrate. Embodiments of the patterning methods are able to provide patterned features with sub-wavelength dimensions, including sub-100 nm dimensions, using conventional light sources, without the use of advanced optical tools.

Figure 1:
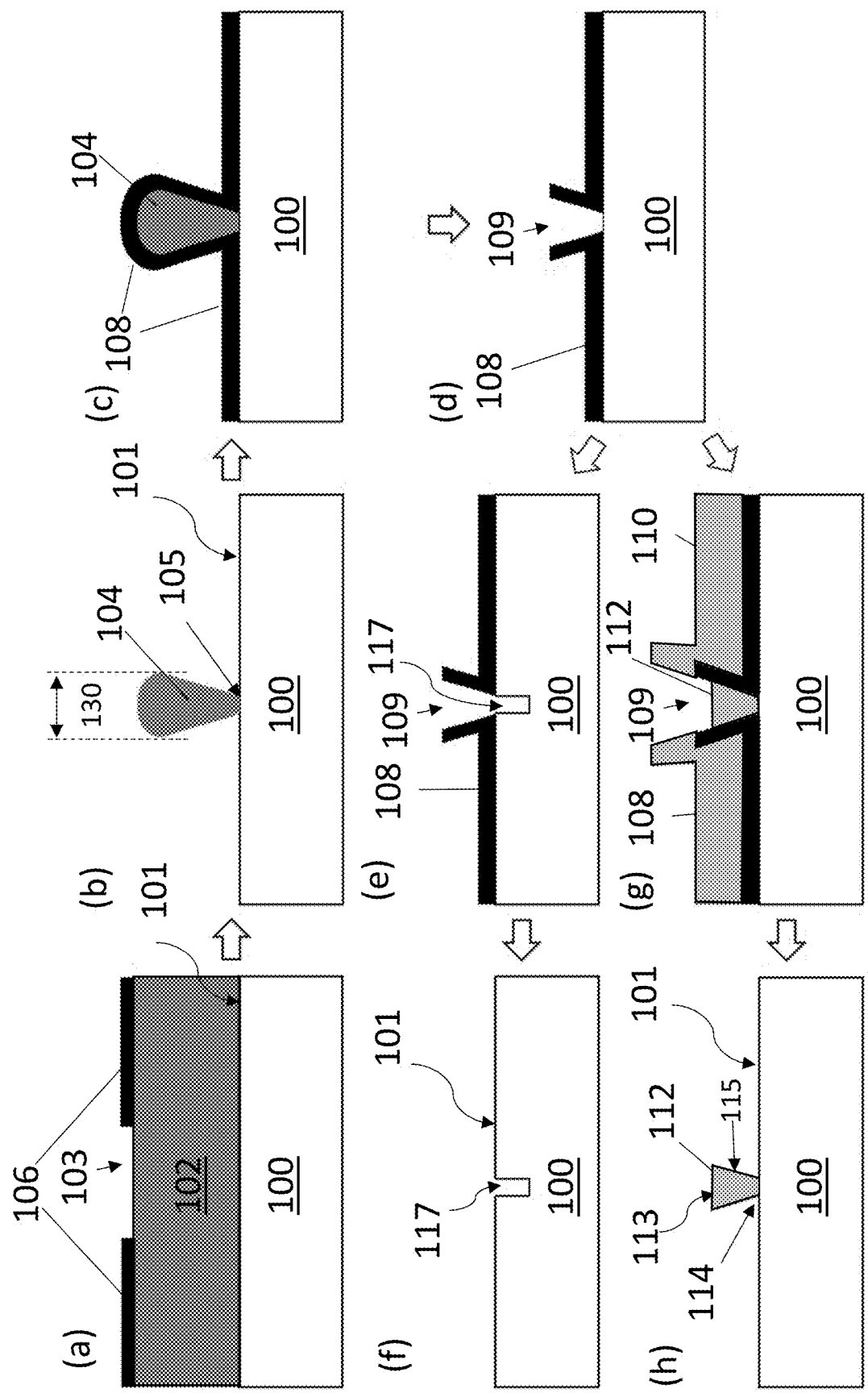
FIG. 1, panels (a) through (h), show the process flow of a sub-wavelength patterning method.

Embodiments of patterning methods are shown schematically in FIG. 1, panels (a) through (h). Initially, a layer of photoresist 102 is formed on the surface 101 of a substrate that is to be patterned 100 (panel (a)). Using photolithography, at least one feature 104 is formed in photoresist 102. Briefly, photoresist 102 can be spin coated onto substrate surface 101, followed by a bake. The photoresist can be a negative tone photoresist or an image reversal photoresist. Image reversal photoresists are switchable photoresists that can be modified so that they behave similarly to negative tone photoresists and create re-entrant profiles upon development. Portions of photoresist 102 are then exposed to radiation, such as ultraviolet (UV) radiation through opening(s) 103 in a photomask 106 to develop the exposed areas of the photoresist and to transfer the pattern defined by the photomask into photoresist 102. Photomask 106 and the undeveloped portions of photoresist 102 are removed using image reversal photolithography, leaving photoresist feature 104 on the surface of the substrate. The upper part of photoresist 102 is crosslinked during the development process and, therefore, the base of photoresist feature 104 develops to a greater extent than the upper part during the photoresist developing process. As a result, photoresist feature 104 has a re-entrant cross-sectional profile in which the lateral dimension (width) 130 at the top of the feature corresponds to photomask opening 103, whereas the lateral dimension (width) of the bottom surface (base) 105 of the feature, which is in contact with the substrate surface 101, is undercut (panel (b)). The extent of the undercut and, therefore, the degree of tapering along the length of photoresist feature 104 can be controlled by the photoresist developing time, the intensity of the UV light exposure, and/or the extent of photoresist crosslinking in the upper part of the photoresist. For example, greater undercutting can be achieved by increasing the UV intensity, extending the photoresist development time, and/or increasing the crosslinking in the upper part of the photoresist. The degree of tapering can be measured by the angle defined between the substrate surface and the sidewall of the re-entrant photoresist feature ("the re-entrant angle"). This is illustrated in FIG. 2D, which shows an enlarged view of a photoresist feature coated by a layer of mask material. The interface between the mask material and the photoresist feature is indicated by a dashed line. The re-entrant angle of this photoresist feature is 84°. In various embodiments of the photoresist features, the re-entrant angle, θ, is in the range of 65°≤θ<90°. By way of illustration, the photoresist features can have re-entrant angles in the range from 70° to 87°, including in the range from 70° to 85° and in the range from 70° to 80°. However, angles outside of these ranges can be also be achieved.

Once photoresist feature 104 has been formed, a conformal layer of a secondary mask material 108 is deposited isotropically over feature 104 and substrate surface 101 (panel (c)). The secondary mask material is a material that is suitable for use as a hard mask material and that can be isotropically deposited and selectively removed. Metals are examples of secondary mask materials. Sputtering is an example of an isotropic deposition method that can be used to form a conformal layer of the second mask material. The use of a secondary hard mask is advantageous because metal hard masks are resistant to many plasma (dry) etching processes and, therefore, can be much thinner than a typical photoresist mask.

Next, photoresist feature 104 and a portion of secondary mask material 108 that is coated onto feature 104 are removed, leaving an opening 109 in the remaining layer of secondary mask material 108 (panel (d)) through which substrate surface 101 is exposed. As illustrated here, a collar is formed around opening 109 by a portion of hard mask 108 that remains after photoresist feature 104 is removed. Opening 109, along with the openings created by the removal of other photoresist features (not shown here), define a pattern over substrate surface 101. Photoresist features can be removed using, for example, a lift-off process aided by an ultrasonic cleaner.

Through the openings 109, substrate surface 101 can be patterned via additive (panels (g) and (h)) and/or subtractive (panels (e) and (f)) methods. The structures formed by these methods, including electrical contact pads, electrical traces, and/or trenches, can have widths of 100 nm or lower, including widths of 70 nm or lower, and widths of 50 nm or lower.

An additive patterning process is shown schematically in panels (g) and (h) of FIG. 1. In this embodiment of an additive patterning process, a material 110 is deposited over secondary mask material 108 and into opening 109 (panel (g)) by, for example, sputtering, to form a deposited feature 112 in the shape of opening 109. The cross-sectional profile of deposited feature 112 will adopt the re-entrant profile of opening 109. Thus, as shown in FIG. 1, deposited feature 112 will have a unique, trapezoidal cross-sectional profile defined by an upper surface 113, a base 114 in contact with substrate surface 101, and a sidewall (or sidewalls) 115 connecting upper surface 113 to base 114. Once feature 112 has been formed, secondary mask material 108 can be removed (panel (e)). The angle formed between the surface of the substrate and the sidewall of the deposited feature ("the sidewall angle") is determined by the re-entrant angle of the photoresist feature that was used in the patterning process. Thus, in various embodiments of the deposited features, the sidewall angle, θ', is in the range of 65°≤θ'<90°. By way of illustration, some embodiments of the deposited features can have sidewall angles in the range from 70° to 87°, including in the range from 70° to 85° and in the range from 70° to 80°.

The deposited material can be, for example, an electrically conductive material, such as a metal, a semiconductor material, a dielectric material, or a combination thereof. For example, if the deposited material is intended to form a gate stack in a transistor, it may include a layer of dielectric material and a layer gate metal over the dielectric material. The deposited features may take a variety of forms, depending on the shapes defined by the openings in the hard mask. For example, the deposited features may comprise elongated lines and/or an array of dots. In some embodiments, the deposited feature is an electrically conductive contact, such as a trace of a contact pad, in an electrical device, such as a transistor or an integrated circuit. By way of illustration, the deposited feature can be a gate metal stack in a high-frequency transistor. A gate metal stack having a trapezoidal cross-sectional profile is advantageous because the narrow base of the gate metal stack is suitable for contact with a very small gate, which allows for high-performance (high-frequency), while the wider upper surface of the gate metal stack allows for a reduced electrical resistance across the gate metal line. Thus, the trapezoidal gate metal stacks can be used in place of more complicated gate metal structures, such as mushrooms gate metal stacks or T-shaped gate metal stacks. Transistors into which the metal features made in accordance with the present methods can be incorporated include field effect transistors (FETs), such as metal oxide semiconductor field effect transistors (MOSFETs) and metal semiconductor field effect transistors (MESFETs), and HEMTs.

An subtractive patterning process is shown schematically in panels (e) and (f) of FIG. 1. In this embodiment of an subtractive patterning process, the surface of substrate 100 is etched through opening 109 to define a trench 117 extending into the surface of the substrate (panel (e)). Once trench 117 has been formed, secondary mask material 108 can be removed (panel (e)). Although a trench is used as an illustrative example, other features can be defined into the surface, including holes.

EXAMPLE

This example illustrates photolithography-based patterning of sub-wavelength (nanoscale) features in a silicon wafer substrate using photoresist features have re-entrant profiles to form a secondary metal hard mask.

Sub-Wavelength Patterning Process and Analyses on the Developing Process:

The process flow for the sub-wavelength patterning method is shown in FIG. 1. Details of the methods are provided in the experimental section, below. FIG. 1, panel (a) shows a layer of the photoresist coated on a substrate. A mask defining an opening was disposed over the photoresist. The photoresist was exposed to ultraviolet (UV) light through the aperture to develop the underlying photoresist. The undeveloped photoresist and mask were then removed, leaving a feature having a re-entrant profile in the remaining, developed photoresist (panel (b)). The layer of photoresist was formed by spin-coating and resist beads created at the edges of the substrate during the spin coating process were removed to allow a uniform hard contact between the mask and the photoresist. As a result of this image reversal photolithography process, the cross-section geometry of the profile of each of the re-entrant photoresist features was a reverse trapezoid, since the upper part of each photoresist feature was cross-linked during the image reversal process to endure the resist developing process. With additional development time, the top edges of the photoresist rounded, whereas the bottom width was further reduced resulting in an extreme re-entrant profile, as shown in FIG. 1, panel (b), due to the developing rate differences. The next step was the deposition of Cr (500 nm) over the photoresist features and the exposed portions of the substrate surface using an isotropic sputter deposition tool (panel (c)). The deposited Cr layer covered all the surfaces of the sample, including the sidewalls of the photoresist features as shown in FIG. 1, panel (c). Immersing the structure in acetone and applying ultrasonic vibration uniformly disintegrated the photoresist features and the Cr layer around them, exposing the substrate through the openings defined by the remaining Cr hard mask (panel (d)). Because the openings were defined by the reduced width at the bottoms of the re-entrant features, the size of the openings in the Cr layer was reduced significantly relative to the size of the openings in the original mask.

The Cr hard mask can be used for dry etching a pattern into the substrate (panel (e), followed by removal of the hard mask (panel (f), or for depositing a material onto the substrate (panel (g), followed by removal of the hard mask (panel (h). For example, FIG. 1, panel (e) shows a channel that was dry-etched into the substrate using reactive ion etching (RIE), and FIG. 1, panel (f) shows the channel dry-etched into the substrate after removing the remains of the Cr layer with a Cr etchant. FIG. 1, panel (g) shows a metal strip that was deposited onto the substrate surface through the patterned Cr hard mask using an electron beam evaporator, and FIG. 1, panel (h) shows the patterned metal strip after removing the Cr layer with a Cr selective etchant. Cr was used as the mask layer in this example due to the etchant's high selectivity against other metals, semiconductors, and insulators. However, other hard mask materials, including other metals, can be substituted, provided they can be isotropically deposited and selectively removed.

One important aspect of this method is the development of the photoresist features having re-entrant profiles. For this example, an AZ 5214E (Microchemicals) image reversal resist was applied. Forming features with re-entrant profiles in the image reversal resist depended on three controllable parameters. The first parameter was the dose of UV exposure, which should be minimized to prevent the photoresist near the substrate from being affected. The second parameter was the crosslinking of the image reversed photoresist. The last parameter was the resist developing time after a flood exposure with sufficient UV light. The first two parameters were kept constant and only the developing times for all the experiments were varied. Details regarding the first two parameters are explained in the Experimental Section, below.

Figure 2A:
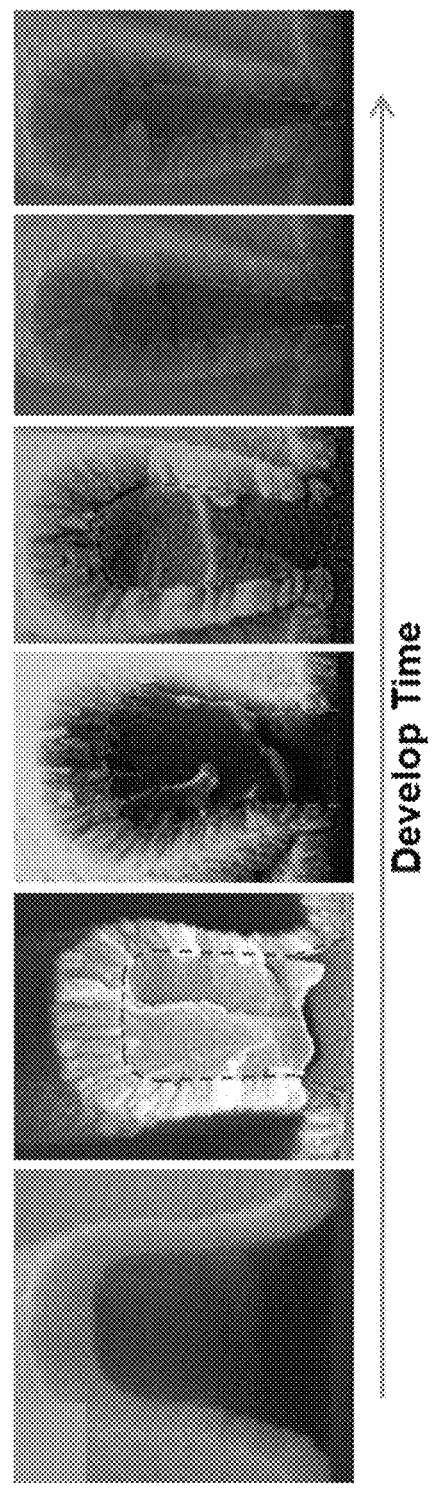
FIGS. 2A-2D show the change in the profile of a photoresist feature as a function of developing time.
Figure 2B:
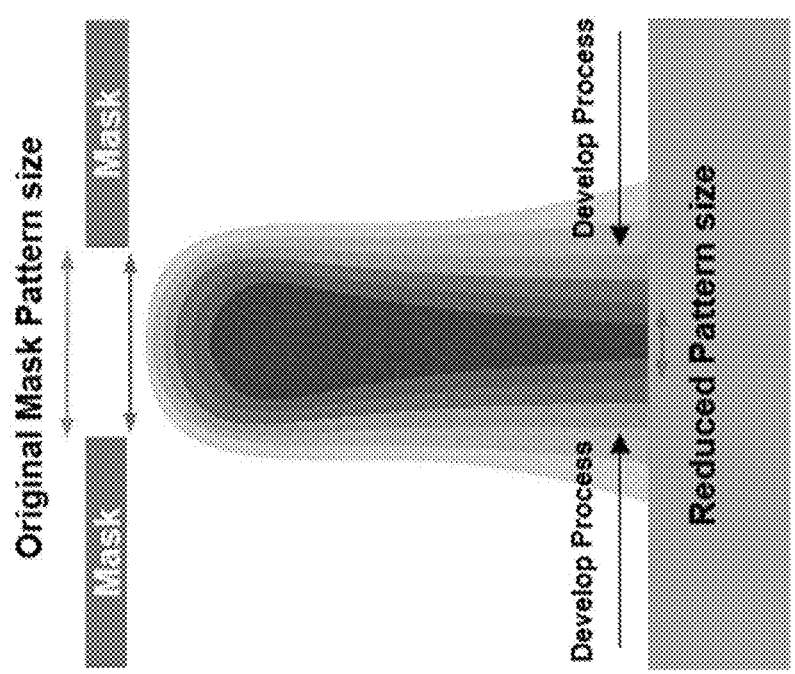

FIG. 2A shows scanning electron microscope (SEM) images of a photoresist feature over time and illustrates how the profile of a photoresist feature changed with increasing resist developing time. In the SEM images the photoresist features are covered with a layer of Cr that was deposited via sputtering. The developed profiles of the photoresist features are indicated by the dashed lines and the developing time increased from left to right. As the developing time increased, the width of the bottom parts of the photoresist features decreased. The profiles are merged and shown in the schematic illustrations in FIG. 2B to assist with the visualization of the decreasing base width of the features. The rate of photoresist development at the upper region of the photoresist features was lower than that of the lower regions of the photoresist features (i.e., near the substrate), because of the crosslinking of the photoresist near the mask.

Figure 2C:
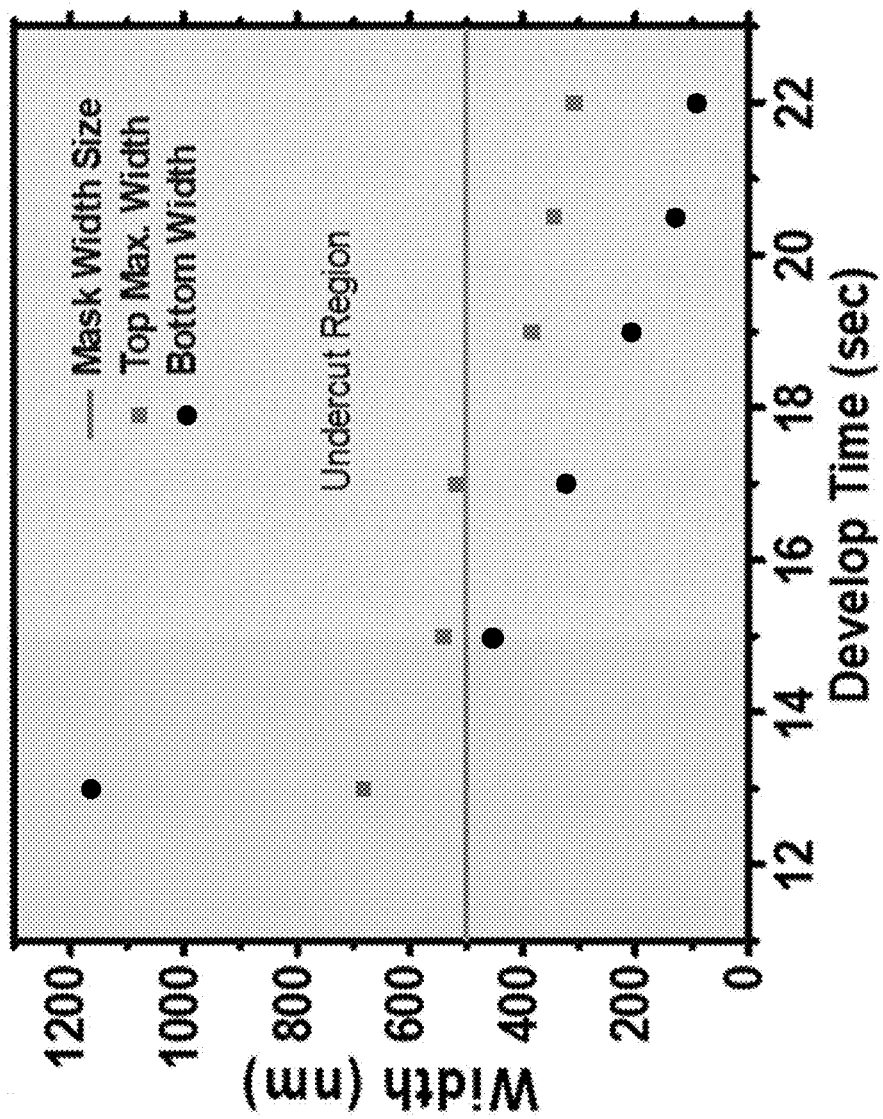
Figure 2D:
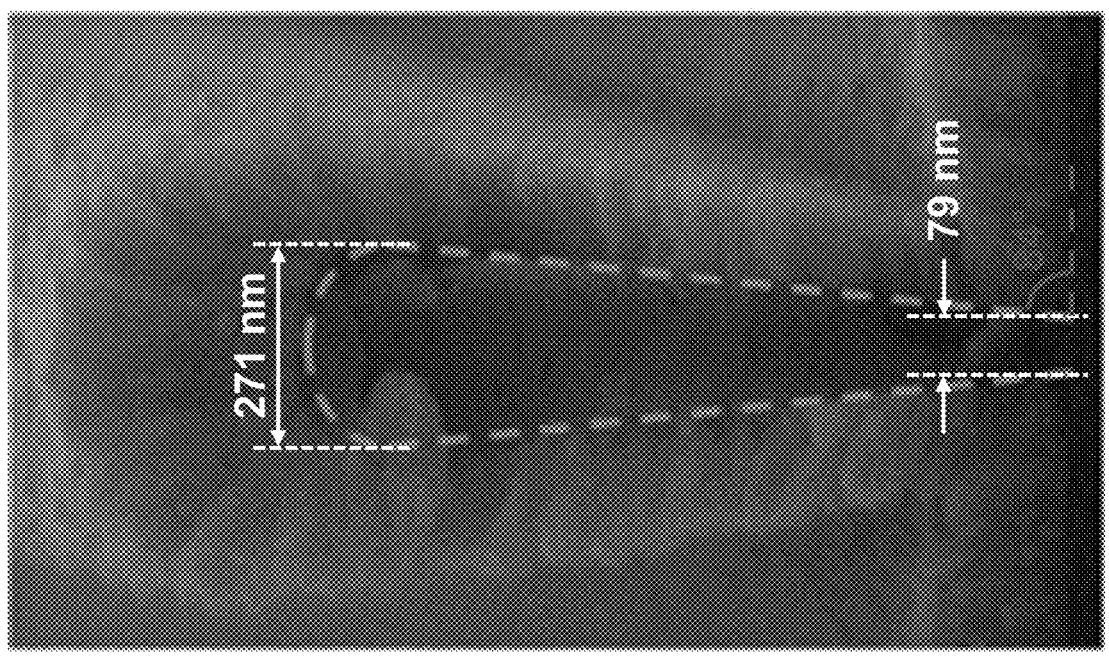
Figure 3A:
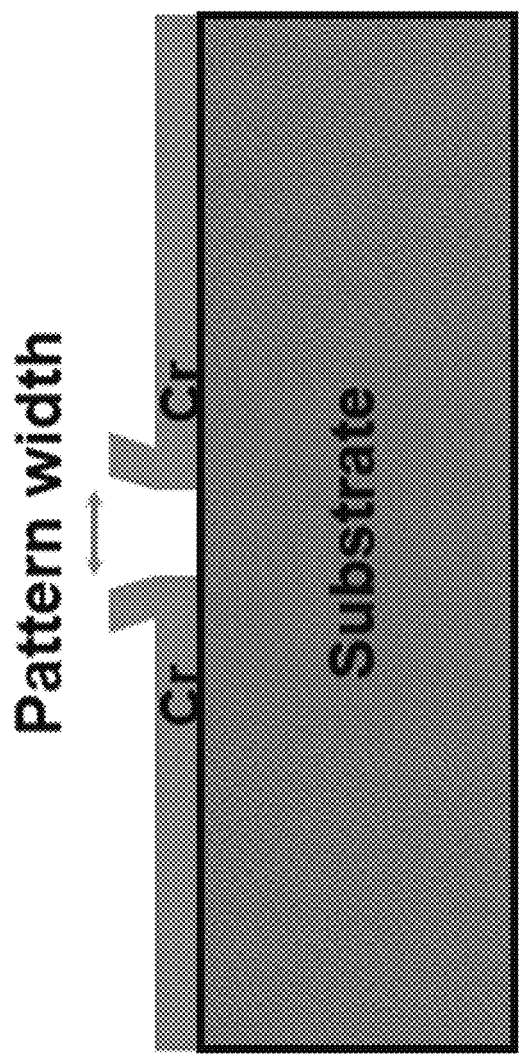
FIG. 3A through 3C show hard mask opening widths formed using original masks having different mask opening sizes.

FIG. 2C is a graph showing the measurements of the maximum widths and base widths of the developed photoresist features as a function of developing time. The width of the openings in the original mask pattern was 500 nm, as indicated by the line across the graph. The two widths (maximum/top and base/bottom) of the patterned photoresist features and the width of the opening in the original mask pattern were matched after around 15 seconds of development; the measured widths of both the upper (maximum) and bottom (base) regions of the features were around 500 nm. For development times greater than 15 seconds, the developing process started to undercut the photoresist, while maintaining the upper region width at 500 nm, characterizing a re-entrant profile photolithography process where the width at the bottom part of photoresist is shorter than that of the upper region of the photoresist. The development of the undercut is a key process for the sub-wavelength patterning of the substrate. With further development, the width at the bottom of the photoresist features was narrowed down to 100 nm (at 22 seconds). At 100 nm, it can become important to carefully rinse the developer to prevent the photoresist features from sagging. After the rinsing process, a Cr layer was sputter deposited over the re-entrant photoresist features deposited. Finally, to expose the substrate though a nanopatterned hard mask, the Cr layer at the sidewalls of the photoresist features was cracked by applying ultrasonic vibration in acetone, leaving openings in the Cr layer, as shown in FIG. 3A. Notably, as a result of the process used to form the opening in the openings in the Cr layer, those holes are tapered from top to bottom. This tapering is shown schematically in FIG. 3A and is visible in the SEM images of the edge walls of the openings shown in FIG. 3B.

Figure 3B:
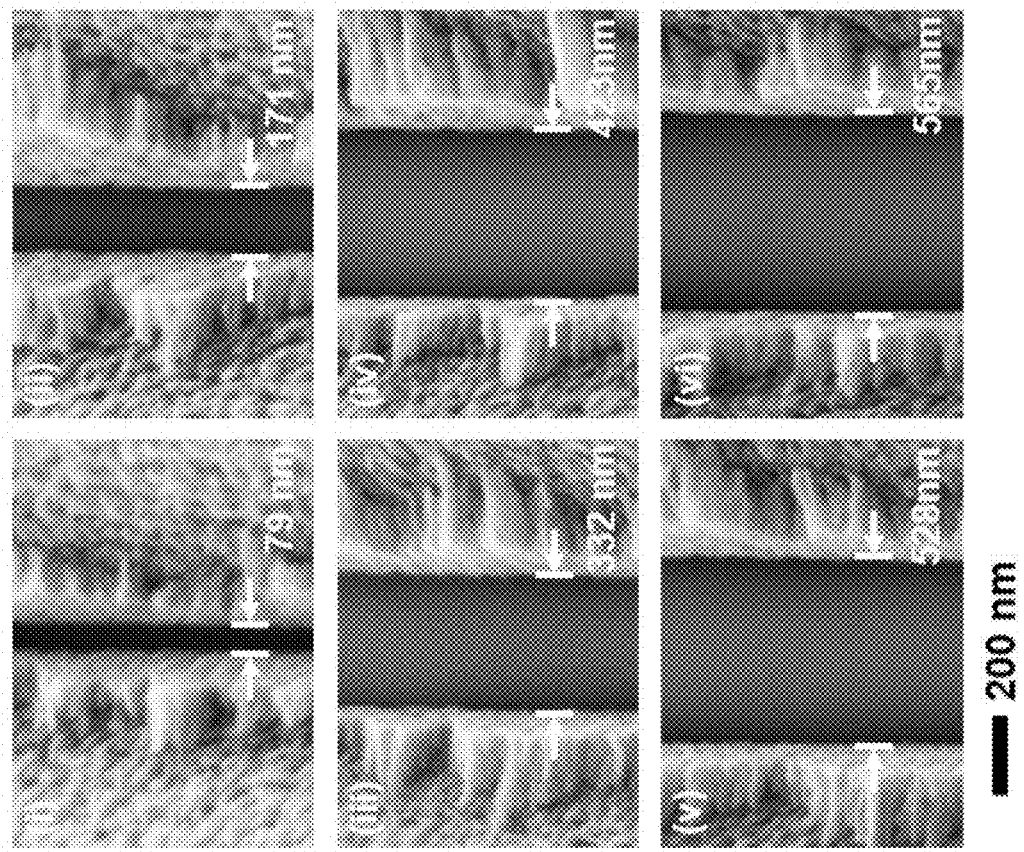
Figure 3C:
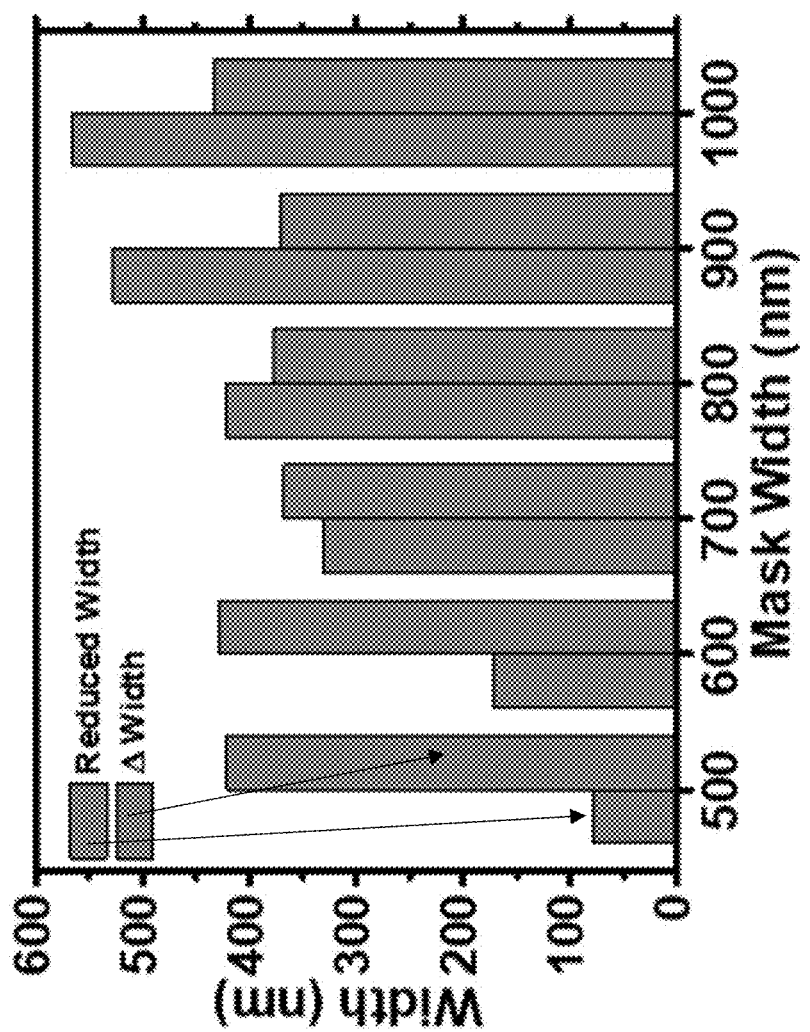

Further experiments were conducted to test the photoresist's narrowing effect by varying the original mask pattern size. The mask pattern widths varied from 500 nm to 1 μm with an increment of 100 nm and the resulting photoresist feature profiles were analyzed in detail, as shown in FIG. 3B and 3C. The patterns were processed and analyzed on a single sample substrate to preserve all other conditions, except for the mask pattern size. The SEM images of the exposed substrate area, post-processing, for masks with different opening widths are shown in FIG. 3B from the top view to determine the reduced opening width. FIG. 3B, panels (i)-(vi) show the patterning results using original masks with opening widths of 500 nm, 600 nm, 700 nm, 800 nm, 900 nm, and 1 μm, respectively. FIG. 3C is a graph that shows the width of the openings formed in the Cr hard mask ("the reduced width") and the change in the widths of the hard mask openings formed using the re-entrant photoresist features relative to the width of the openings in the original mask pattern width. On average, the widths of the openings in the hard mask versus the openings in the original mask were reduced by 400 nm.

Figure 4C:
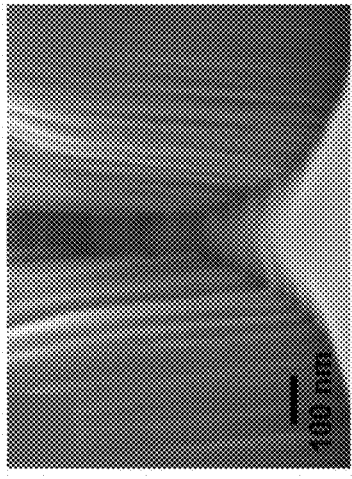
FIGS. 4A-4F depict SEM images of various patterns deposited on a substrate.
Figure 4B:
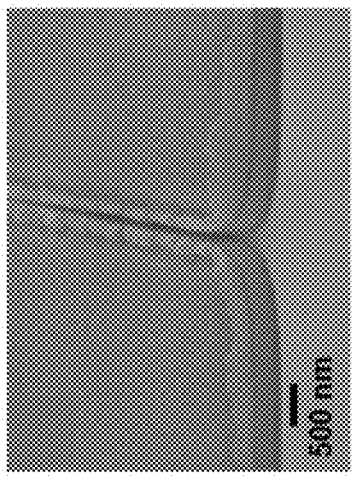
Figure 4A:
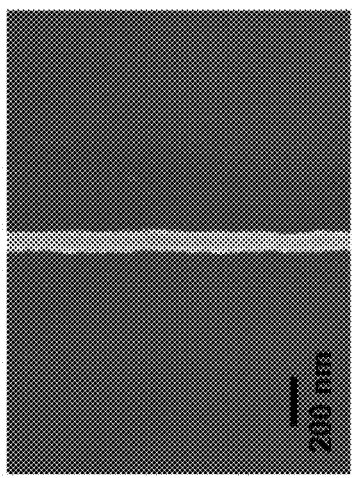

Post-Process Results and Application to AlGaN/GaN HEMT Fabrication:

FIG. 4A through FIG. 4F show the results of a material deposition process and a dry etching process carried out using the size-reduced patterns in the secondary Cr hard mask. FIG. 4A shows an SEM image of a metal (Ni/Au) strip with a width of less than 100 nm on the silicon wafer substrate. The Cr layer can be used as a sacrificial layer for the lift-off process when the thickness of the deposited materials is thinner than that of the Cr layer. The Ni/Au was deposited using an electron beam evaporator. Alternatively, the Cr layer can be used as a secondary mask for a dry etching process. FIG. 4B shows the results of a wafer etching process using inductively coupled plasma—reactive ion etching (ICP-RIE). Here, the remaining Cr hard mask was left on top of the Si substrate. However, if desired, it can be removed with a Cr etchant. The etched trench area is magnified in FIG. 4C, which shows the Si substrate vertically dry etched with the shape of the channel in Cr hard mask.

Figure 4F:
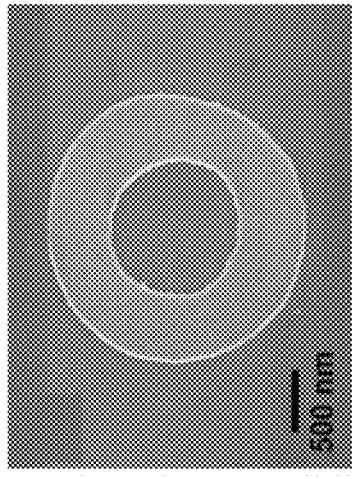
Figure 4E:
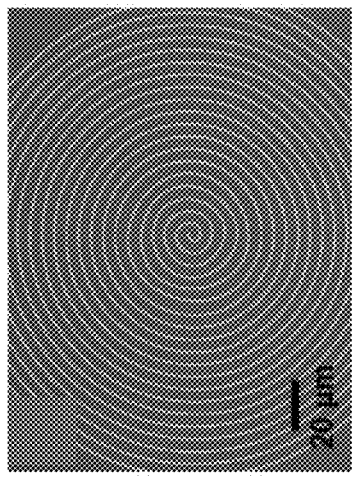
Figure 4D:
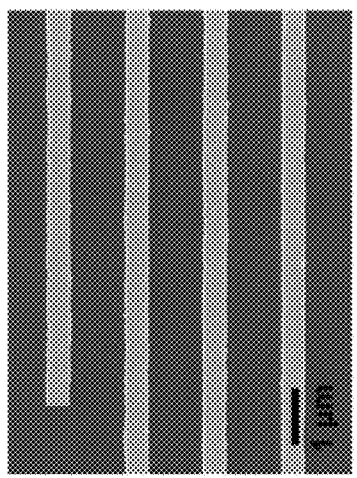

Materials were deposited in different patterns onto the substrate using the photolithography-based nanopatterning methods. For example, FIG. 4D shows arrays of metal strips (Ni/Au) deposited on the Si substrate. The width of the strips was 420 nm, and they were separated by distances of 1 μm. FIG. 4E shows a metal line deposited in a spiral shape and FIG. 4F shows the SEM image of a donut-shaped metal deposition. The array of strips, spiral, and donut-shaped patterns were processed on the same substrate using a single lithography process. These patterns can be processed in a wafer scale at once, an advantage of the contact photolithography method.

Figure 5A:
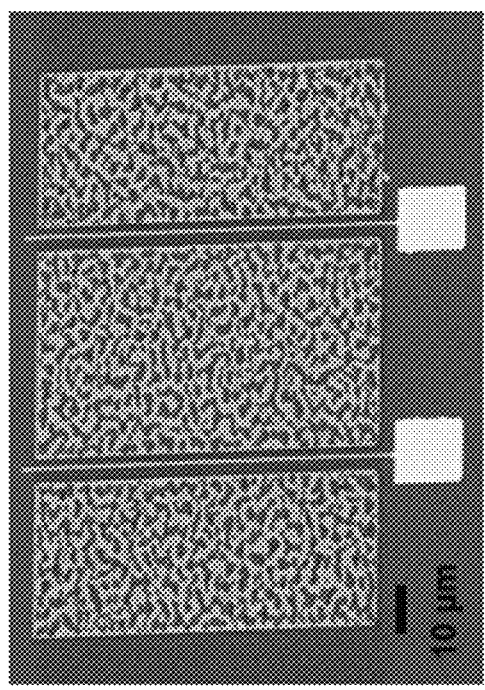
FIGS. 5A-5F depict AlGaN/GaN HEMT fabrication via contact photolithography-based nanopatterning.
Figure 5B:
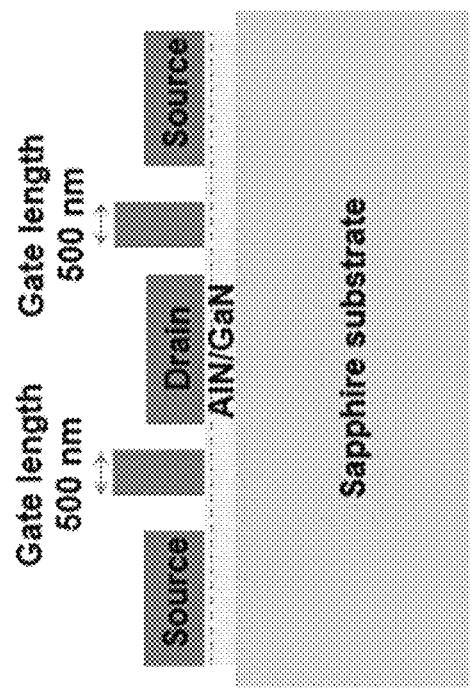
Figure 5D:
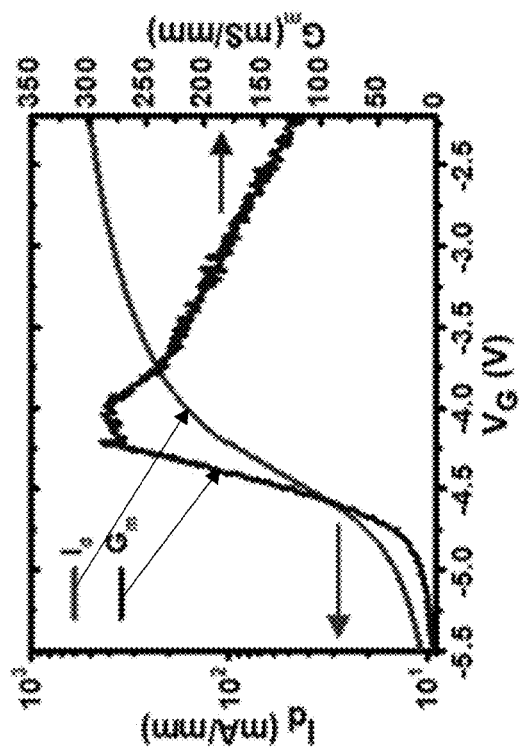
Figure 5C:
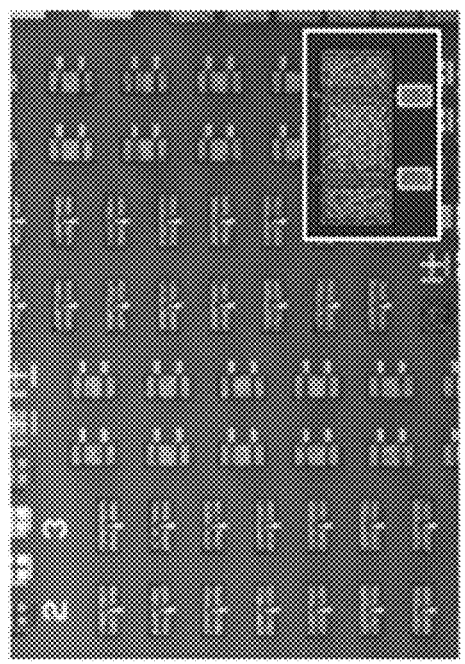

One of the key applications of the nanoscale patterns is in radiofrequency (RF) electronics. As an example, a high-performance RF device where the frequency response can be dramatically improved by reducing the gate lengths using the reduction approach was demonstrated. As a way of demonstrating the usefulness of the patterning process for practical applications, gallium nitride-based high electron mobility transistor (GaN HEMT) gate length reduction was demonstrated. A typical method of fabricating a gate metal uses e-beam lithography to achieve a short gate length, which is often time-consuming and limited to small sample size. The sub-wavelength photolithography method, which can be used to replace an e-beam lithography method, was used to fabricate an array of HEMT devices on a 2.5 mm by 2.5 mm large surface area. FIG. 5A shows a schematic of an HEMT device fabricated with double gate fingers. The substrate was an $Al_{0.3}Ga_{0.7}N/AlN/GaN$ heterostructure, which formed a 2-dimensional electron gas (2-DEG) for the channel and was grown on a sapphire wafer. A mesa process was patterned and defined using ICP-RIE. Source and drain metal pads were deposited, followed by annealing in 800° C. for 1 min to make ohmic contact with the substrate. Gate fingers were deposited onto the substrate using the sub-wavelength photolithography process described herein and the Cr layer was used for the lift-off process (FIG. 5B). After passivating the devices with $Al_2O_3$ and $Si_3N_4$, the opening of the via holes was processed by RIE. FIG. 5C shows an optical image of an HEMT array with the via holes opened. The inset image of 5C shows a magnified HEMT device ready for the RF metal pad deposition. Finally, RF metal pads were deposited to measure the performance of the HEMT device. FIG. 5D shows the DC performance of the 2×50 μm double gate finger HEMT device with 4.5 μm drain to source separation. One line represents the transfer curve and the other line represents the transconductance curve, both normalized with the gate width. In measuring the performance, the gate voltage was swept from −5.5 V to 0 V while holding the drain to source voltage at 8 V. The maximum transconductance was 289 mS/mm at $V_g$=−4.04 V, which was the bias point used to measure the RF performance. FIG. 5E shows the normalized I-V characteristics of the same device. The drain currents were measured by changing the gate voltages from −5 V to −1 V with a step size of 1 V, while the drain voltage was swept from 0 V to 10 V.

Figure 5F:
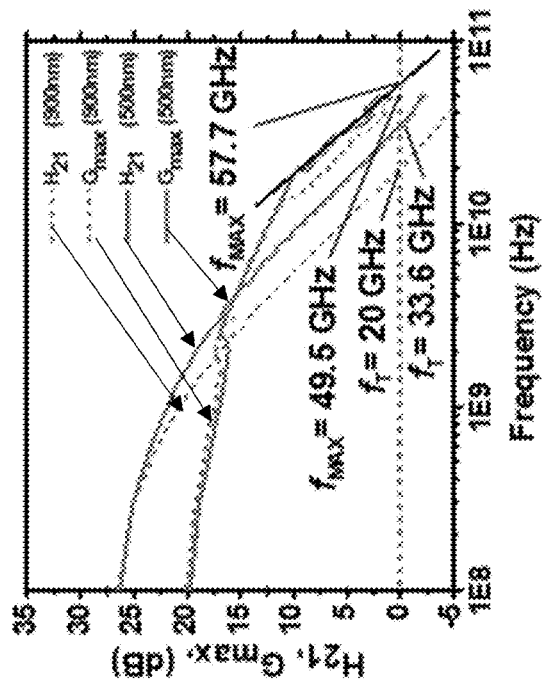
Figure 5E:
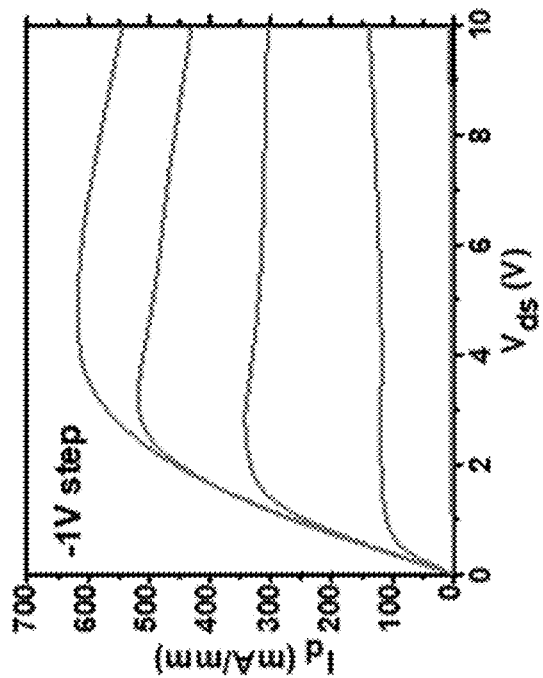

FIG. 5F shows the RF performance of the devices with the same dimensions except for the gate length. The gate length without reduction was 900 nm and was reduced using the present methods to 500 nm. The measured unity current gain frequency ($f_T$) after a de-embedding process was 20 GHz and it was improved to 33.6 GHz when the gate length was reduced to 500 nm. The maximum oscillation frequency ($f_{MAX}$) was also increased from 49.5 GHz to 57.7 GHz. The measured DC and RF performances show typical behavior for a GaN HEMT, demonstrating the contact photolithography-based nanopatterning method is applicable to electronic devices.

Experimental Section:

Sub-wavelength patterning method: On a temporary Si substrate, a layer of photoresist (AZ 5214E, 1 μm) was spin casted at 5,500 rpm for 30 s, followed by soft baking at 95° C. for 3 min. The edge beads of the photoresist were exposed with UV light for 1 min with a dose of 17 mWcm$^{-1}$, while the other area for the patterning experiments was protected with a mask. The light intensity of a Hg-lamp at the mask aligner (MJB3, Karl Suss) was controlled by a power supply (CIC-500, Karl Suss) using feedback from the UV sensor at the aligner, which was calibrated to sense light intensity at a wavelength of 320 nm. After developing with a developer (AZ 917, Microchemicals) for 30 s and rinsing with deionized (DI) water, the remaining photoresists of the edge beads were swabbed with acetone-soaked Q-tips. The sample was placed on a hot plate at 95° C. for 1 min to vaporize remaining solvents at the photoresist and the Si substrate. The patterns were transferred to the photoresist by exposing them with UV light for 6 s after hard contacting the photoresist to the mask. The photoresist features were image reversed by baking on a hotplate at 110° C. for 90 s. After developing the photoresist features having re-entrant profiles, Cr was deposited by sputtering (CVC 601, 500 nm) to make a secondary mask layer. Immersing the structure in acetone and applying ultrasonic vibration removed the photoresist features and swabbing with Q-tips. For the Si substrate etching process, ICP-RIE (Plasma-Therm SLR Series, $BCl_3$=20 sccm, $Cl_2$=20 sccm, Pressure=5 mTorr, RF1 Power=200 W, RF2 Power=300 W) was used for 2 min, followed by removal of the Cr layer with a Cr etchant (CEP-200, Microchrome Technology). An electron beam evaporator was used for the deposition process followed by lift-off of the Cr layer with Cr etchant.

Fabrication of AlGaN/GaN HEMT: The fabrication began with AlGaN/GaN layers epitaxially grown on a double-sided polished sapphire wafer (4-inch diameter, CREE). The epitaxial layers consisted of undoped GaN (5 μm), undoped AlN (1 nm), undoped $Al_{0.3}Ga_{0.7}N$ (20 nm), and updoped GaN layer (2 nm). The GaN substrate was diced into 6 mm×6 mm squares with a dicing saw. Mesa patterns for an individual HEMT device were defined using photolithography (AZ 5214E) followed by etching 80 nm of the GaN layer with ICP-RIE (Plasma-Therm SLR Series, $BCl_3$=10 sccm, $Cl_2$=16 sccm, Ar=3 sccm, Pressure=4 mTorr, RF1 Power=100 W, RF2 Power=500 W, recipe). After removing the residual photoresist from the GaN layer, source and drain metal pads were patterned for the lift-off process with photoresist (AZ 5214E). Rinsing with diluted HCl (HCl: deionized water=1:3) for 1 min removed the oxide layer on the GaN surface. Ohmic metal layers (Ti/Al/Ni/Au, 20 nm/100 nm/45 nm/55 nm) were deposited with an electron-beam evaporator via the lift-off process followed by a rapid thermal annealing (Heatpulse 610, AG Associates) process at 800° C. for 1 min in $N_2$ ambient condition. Gate metal layers were patterned with the sub-wavelength patterning method using Cr (500 nm), and deposited with Ni/Au (20 nm/400 nm) layers using an electron beam evaporator. After the lift-off process with Cr etchant, the devices were passivated with $Al_2O_3$ (20 nm) using atomic layer deposition (ALD) and $Si_3N_4$ using plasma enhanced chemical vapor deposition (Plasma Therm, 200 nm). Via holes were opened at gate, source, and drain metal pads using RIE followed by deposition of RF metal pads (Ti/Au, 10 nm/250 nm) using an electron-beam evaporator.

Measurement and analysis: The DC performance of the HEMT was measured using an HP 4155B Semiconductor Parameter Analyzer. An Agilent E8364A PNA Series Network Analyzer was used to measure the S-parameter of the HEMT with the measurement set-up calibrated to the Infinity G-S-G probe tips with 150 μm pitch using a standard Short-Open-Load-Thru (SOLT) calibration kit. The S-parameters obtained from the RF measurements were analyzed using the Advanced Design System (ADS) software.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A transistor comprising:
   a substrate having a substrate surface; and
   a gate stack having a trapezoidal cross-sectional profile on the substrate surface, the gate stack comprising a layer of dielectric material and a layer of metal over the layer of dielectric material and having an upper surface, a base in contact with the substrate surface, and a sidewall connecting the upper surface to the base, wherein the gate stack is tapered from the upper surface to the base, such that the width of the upper surface is larger than the width of the base, and further wherein the width of the base is less than 100 nm.

2. The transistor of claim 1, wherein an angle between the substrate surface and the sidewall is in the range from 68° to 87°.

3. The transistor of claim 1, wherein the angle between the substrate surface and the sidewall is in the range from 70° to 85°.

4. The transistor of claim 1, wherein the transistor is a field effect transistor.

5. The transistor of claim 1, wherein the transistor is a high electron mobility transistor.

* * * * *